United States Patent
Kim

(10) Patent No.: US 10,429,867 B1
(45) Date of Patent: Oct. 1, 2019

(54) LOW DROP-OUT VOLTAGE REGULAR CIRCUIT WITH COMBINED COMPENSATION ELEMENTS AND METHOD THEREOF

(71) Applicant: Winbond Electronics Corp., Taichung (TW)

(72) Inventor: Jungung Kim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/145,224

(22) Filed: Sep. 28, 2018

(51) Int. Cl.
| H02M 3/158 | (2006.01) |
| G05F 1/575 | (2006.01) |
| H03F 3/45 | (2006.01) |
| G05F 1/46 | (2006.01) |

(52) U.S. Cl.
CPC ............. *G05F 1/575* (2013.01); *G05F 1/468* (2013.01); *H02M 3/158* (2013.01); *H03F 3/45273* (2013.01)

(58) Field of Classification Search
None
See application file for complete search history.

(56) References Cited

U.S. PATENT DOCUMENTS

| 6,518,737 | B1 * | 2/2003 | Stanescu | G05F 1/575 323/280 |
| 7,218,083 | B2 * | 5/2007 | Wang | G05F 1/575 323/273 |
| 2006/0197513 | A1 * | 9/2006 | Tang | G05F 1/575 323/273 |
| 2013/0169251 | A1 * | 7/2013 | Wan | G05F 1/56 323/282 |
| 2013/0307502 | A1 * | 11/2013 | Bhattacharyya | G05F 1/565 323/282 |
| 2016/0062377 | A1 | 3/2016 | Fort et al. | |
| 2018/0173258 | A1 * | 6/2018 | Singh | G05F 1/575 |

FOREIGN PATENT DOCUMENTS

| CN | 103713682 | 8/2015 |
| TW | 201205226 | 2/2012 |

* cited by examiner

*Primary Examiner* — Jeffrey A Gblende
(74) *Attorney, Agent, or Firm* — JCIPRNET

(57) ABSTRACT

The disclosure provides an LDO voltage regulator circuit and a related method. The circuit includes an error amplifier having a localized common-mode feedback circuit, receiving a reference voltage, a feedback voltage, and an input voltage, and generating an amplified error voltage; a pass element having a power transistor, receiving the amplified error voltage, and generating an output voltage; a feedback circuit receiving the output voltage and having a voltage divider which scales down the output voltage; a first compensation element having a first terminal which connects to an output of the input differential transistor pair and a second terminal which receives the output voltage; and a second compensation element having a third terminal which receives the output voltage and connects to the second terminal and a fourth terminal which connects to an input of a first transistor pair of the localized common-mode feedback circuit.

12 Claims, 7 Drawing Sheets

US 10,429,867 B1

LOW DROP-OUT VOLTAGE REGULAR CIRCUIT WITH COMBINED COMPENSATION ELEMENTS AND METHOD THEREOF

TECHNICAL FIELD

The disclosure is directed to a low drop-out voltage regulator circuit with combined compensation elements and a related method thereof.

BACKGROUND

A low drop-out voltage (LDO) voltage regulator circuit has industry applicability in the field not limited to mobile devices such as smart phones, laptops, video camcorders, and other electronic devices that may relied upon a battery in order to operate. The LDO voltage regulars would ensure such electronic device to require a low voltage and low current so as to function efficiently and with a low power consumption.

An LDO voltage regulator circuit typically has an error amplifier electrically coupled to a pass element, a feedback circuit, and a compensation circuit. The error amplifier typically receives, through an input terminal, an input voltage which is amplified by the error amplifier as an amplified voltage. The amplified voltage is received by the pass element which could be but not limited to a power transistor which would generate an output voltage to drive an external circuit. The feedback circuit would receive and subsequently scale down the output voltage. The scaled down output voltage is sent back to the error amplifier as a feedback voltage. The compensation circuit may include one or more compensation elements to provide a control mechanism to enhance the performance of the LDO voltage regulator. The power mechanism could be implemented by, for example, a Miller compensation circuit.

In a typical LDO voltage regulator circuit, a local common mode feedback circuit and a Miller compensation circuit could be utilized for providing feedbacks and current compensation. However, a Miller compensation circuit may exhibit a slower transient performance as well as an unstable output relative to other methods. Such output perform could be undesirable as excessive ringing and slow transient performance may cause the load to malfunction. Therefore, an LDO voltage regulator circuit that has a better output transient performance as well as a better output voltage stability would be desirable.

SUMMARY OF THE DISCLOSURE

Accordingly, the disclosure is directed to a low drop-out (LDO) voltage regulator circuit and a related method thereof.

In an aspect, the disclosure is directed to LDO voltage regulator circuit which would include not limited to: an error amplifier having a localized common-mode feedback circuit, receiving a reference voltage, a feedback voltage, and an input voltage, and generating an amplified error voltage; a pass element having a power transistor, receiving the amplified error voltage, and generating an output voltage; a feedback circuit receiving the output voltage and having a voltage divider which scales down the output voltage; a first compensation element having a first terminal which connects to an output of the input differential transistor pair and a second terminal which receives the output voltage; and a second compensation element having a third terminal which receives the output voltage and connects to the second terminal and a fourth terminal which connects to an input of a first transistor pair of the localized common-mode feedback circuit.

In another aspect, the disclosure is directed to a method of regulating a voltage by using a LDO voltage regulator circuit with a local common-mode feedback, and the method would include not limited to: receiving, by an error amplifier having a localized common-mode feedback circuit, a reference voltage, a feedback voltage, and an input voltage for generating an amplified error voltage, wherein the reference voltage is sent to an input of an input differential transistor pair; receiving, by a pass element having a power transistor, the amplified error voltage for generating an output voltage; receiving, by a feedback circuit, the output voltage by using a voltage divider to scale down the output voltage; performing a first current compensation by using a first compensation element having a first terminal which connects to an output of the input differential transistor pair and a second terminal which receives the output voltage; and performing a second current compensation by using a second compensation element having a third terminal which receives the output voltage and connects to the second terminal and a fourth terminal which connects to an input of a first transistor pair of the localized common-mode feedback circuit.

In order to make the aforementioned features and advantages of the disclosure comprehensible, exemplary embodiments accompanied with figures are described in detail below. It is to be understood that both the foregoing general description and the following detailed description are exemplary and are intended to provide further explanation of the disclosure as claimed.

It should be understood, however, that this summary may not contain all of the aspect and embodiments of the disclosure and is therefore not meant to be limiting or restrictive in any manner. Also, the disclosure would include improvements and modifications which are obvious to one skilled in the art.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
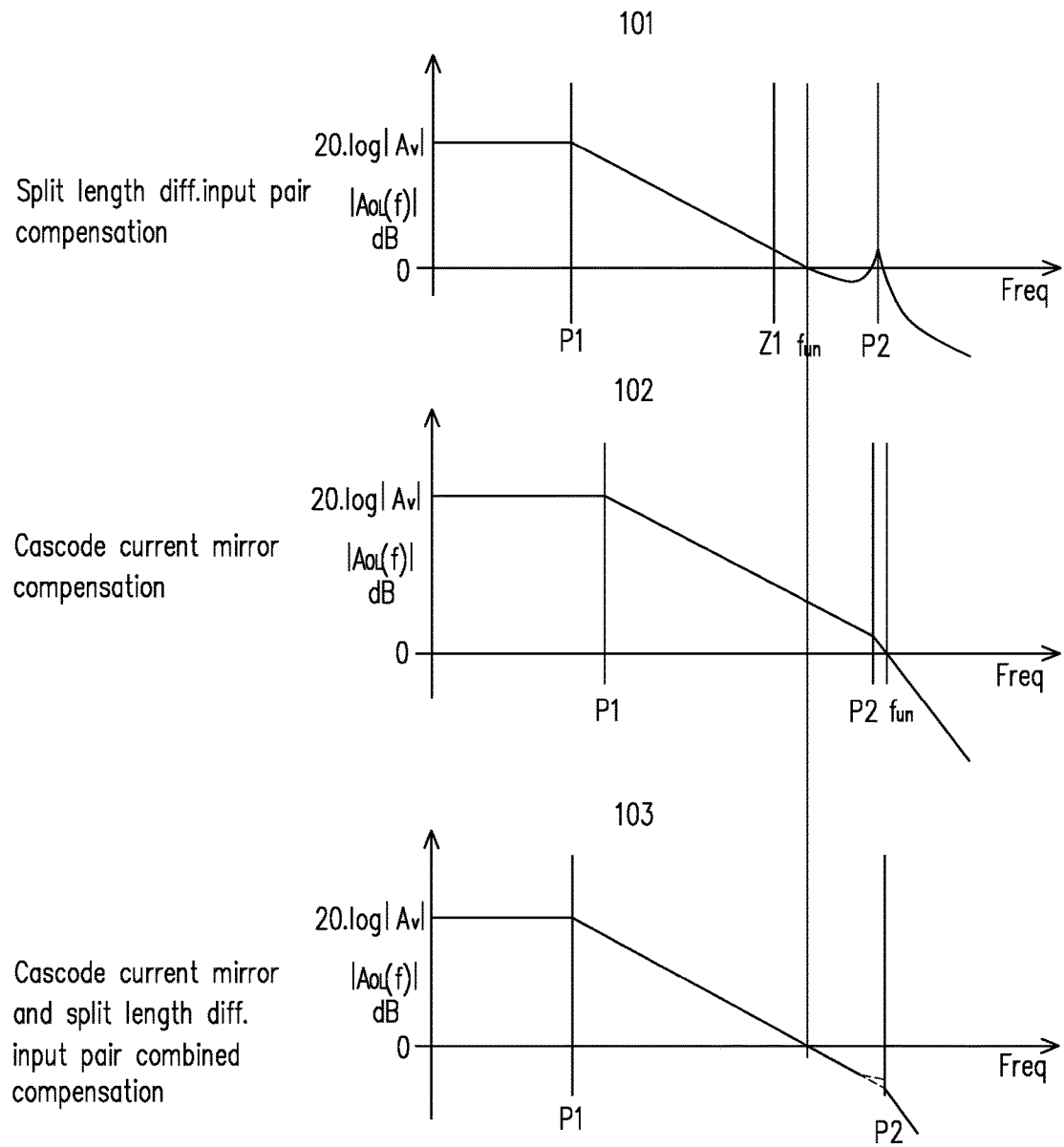
FIG. 1 illustrates an inventive concept of combining a split length differential input pair compensation scheme with a cascode current mirror compensation scheme.

Reference will now be made in detail to the present exemplary embodiments of the disclosure, examples of which are illustrated in the accompanying drawings. Wherever possible, the same reference numbers are used in the drawings and the description to refer to the same or like parts.

A Miller compensation scheme for a LDO voltage regulator with a local common mode feedback in an error amplifier could be used to enhance the gain the and slew rate of the LDO voltage regulator. However, as previously described, the Miller compensation scheme could be relatively unstable in comparison to other schemes. for Class AB (LCMF) amplifier for frequency stability. The Miller compensation scheme may show a slower transient performance and excessive ringing in comparison to indirect compensation methods.

Thus, the disclosure provides a LDO voltage regulator which utilizes an indirect compensation scheme based on a combination of the cascode current mirror compensation scheme and the split length differential input pair compensation scheme. By doing so, a faster transient response and an improved frequency stability in the output regulated voltage could be accomplished.

FIG. 1 illustrates an inventive concept of the disclosure. The first Bode pole-zero plot 101 shows a frequency response of using a split length differential input pair compensation scheme. The second Bode pole-zero plot 102 shows a frequency response of using a cascode current mirror compensation scheme. The third Bode pole-zero plot 103 shows a frequency response of combining the split length differential input pair compensation scheme with a cascode current mirror compensation scheme. In order to improve the phase margin degradation caused by the gain flattening or gain peaking when the split length differential pair compensation scheme is used, the left half plane (LHP) zeros can be used to cancel out the non-dominant poles. In order to achieve the pole-zero cancellation, the cascode current mirror compensation scheme could be used in conjunction with the split length differential pair compensation scheme.

Assuming that the cascode current mirror compensation scheme is to be implemented by using a first compensation element and the split length differential pair compensation scheme is to be implemented by using a second compensation element, by adjusting the capacitance value $C_{C1}$ of the first compensation element scheme and the capacitance value $C_{C2}$ of the second compensation element as well as the effective gain gm1 at a split pair node and the effective gain gm2 of the common-gate device which is connected to $C_{C2}$, the non-dominant pole-zero doublets might be close together in the frequency domain. Although a perfect pole-zero would likely be impossible to achieve, the overall stability could be improved by using such method.

By using the indirect compensation scheme which includes a combination of a split length differential input pair scheme and a cascode current mirror compensation scheme, the second pole, p2, is pushed further away from the dominant pole, p1, by a factor of approximately $C_C/C_I$ in comparison to Miller compensation case. Hence, pole splitting can be achieved by using a lower value of the compensation capacitor $C_C$ which may lead to a faster performance. For a class AB error amplifier, the split length differential input pair compensation could be more effective for frequency stability, but it may cause gain peaking or flattening to make the phase margin worse. In order to minimize such problem, a cascode current mirror compensation could be used along with the split length diff. input pair compensation. By using the two combined compensation scheme, a faster transient response to a load current step up can be achieved.

Figure 2:
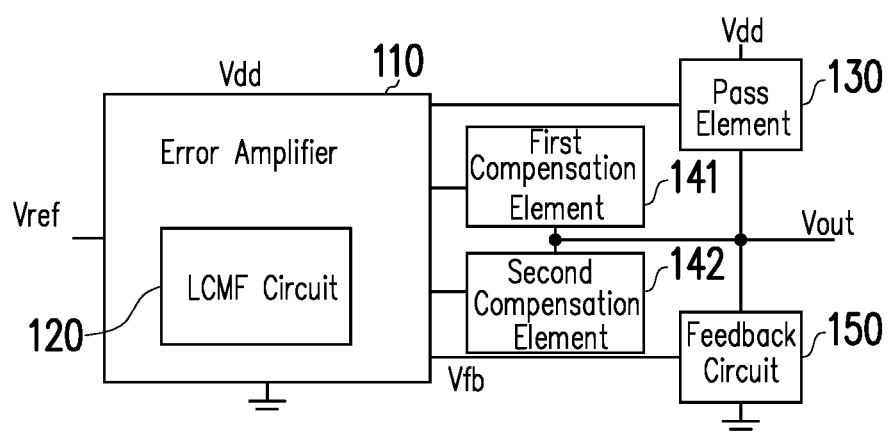
FIG. 2 illustrates a LDO voltage regulator circuit with combined compensation elements in accordance with one of the exemplary embodiments of the disclosure.
Figure 3:
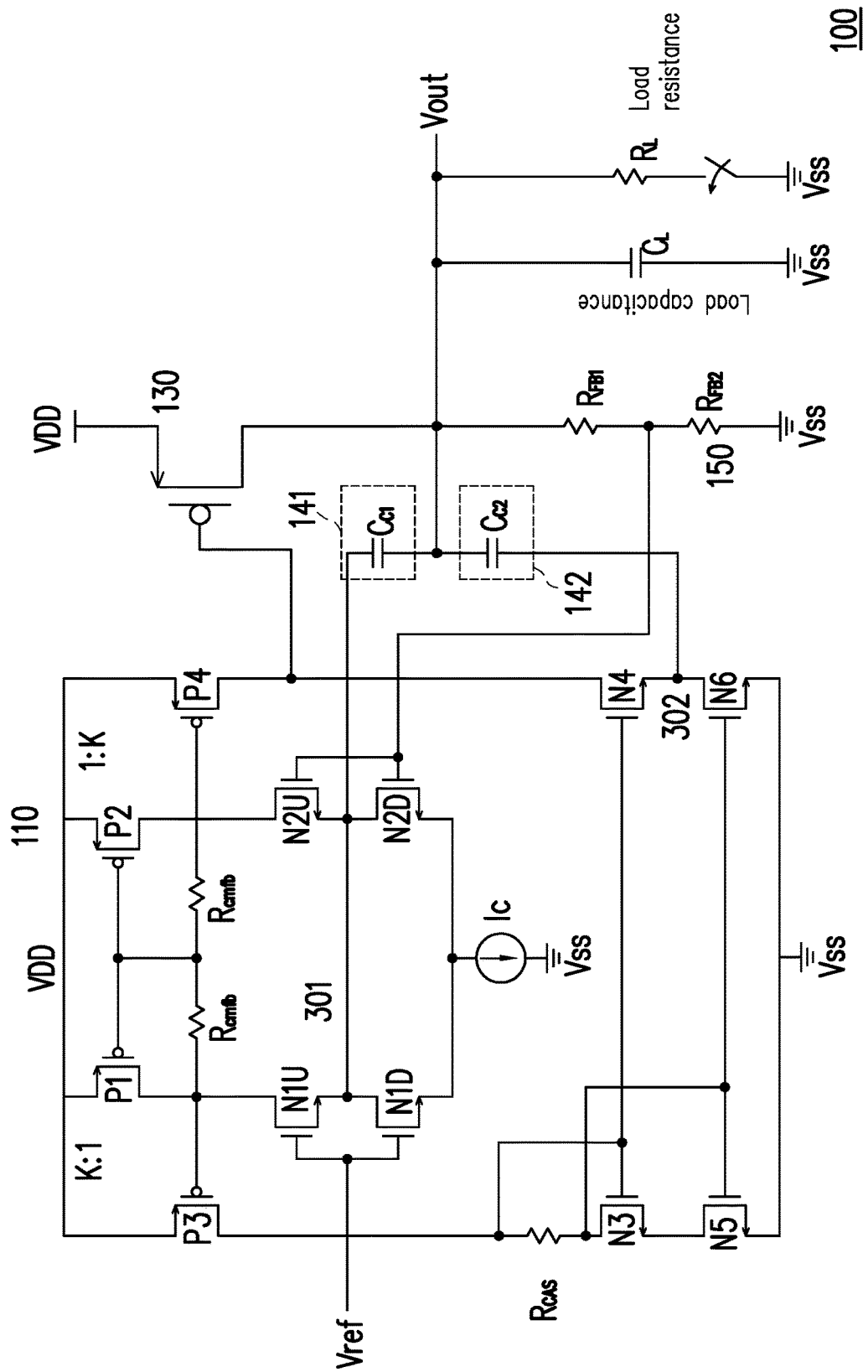
FIG. 3 illustrates a circuit diagram of the LDO voltage regulator circuit of FIG. 2 in accordance with one of the exemplary embodiments of the disclosure.

FIG. 2 illustrates a LDO voltage regulator circuit 100 with combined compensation elements in accordance with one of the exemplary embodiments of the disclosure. The LDO voltage regulator circuit 100 would include not limited to an error amplifier 110 which may contain a localized common-mode feedback (LCMF) circuit 120, a pass element 130, a feedback circuit 150, a first compensation element 141, and a second compensation element 142. FIG. 3 illustrates a circuit diagram of the LDO voltage regulator circuit of FIG. 2 in further detail.

The error amplifier 110 could be implemented by using not limited to a group of PMOS transistors (P1, P2, P3, P4), a group of common mode feedback resistors (Rcmfb), a group of NMOS transistors (N1U, N2U, N1D, N2D), and a current source Ic connected to a ground Vss. The LCMF circuit 120 be implemented by using not limited to a group of NMOS transistors (N3, N4, N5, N6) and a cascode resistor $R_{CAS}$. The pass element 130 would boost the voltage and/or current of the error amplifier 110 and could be implemented by using not limited to a power transistor such as a power PMOS transistor. The feedback circuit 150 could be implemented by using not limited to a voltage divider which contains resistor $R_{FB1}$ and resistor $R_{FB2}$. The first compensation element 141 could be implemented by using not limited to a first capacitor $C_{C1}$, and the second compensation element could be implemented by using not limited to a second capacitor $C_{C2}$.

The error amplifier 110 which contains the LCMF 120 would receive a reference voltage Vref and an input voltage Vdd which would be compared against the reference voltage Vref to generate an amplified error voltage. The amplifier error voltage would be boosted by the pass element 130 to generate an output voltage Vout. A feedback voltage Vfb would be generated based on a scaled down or voltage divided output voltage Vout in order to be fed back to the error amplifier 110 so as to regular the input voltage Vdd toward the reference voltage Vref. The LCMF circuit 120 would be internal to the error amplifier 110 and would enhance the stability of the error amplifier. The reference voltage is sent to an input of an input differential transistor pair (N1U N1D).

The first compensation element 141 has at least a first terminal which connects to an output of the input differential transistor pair (N1U N1D) and a second terminal which connects to the output voltage Vout. The second compensation element 142 has a third terminal which connects to the output voltage Vout which is also the second terminal and has a fourth terminal which connects to an input of a first transistor pair (N4 N6) of the localized common-mode feedback circuit. The first compensation element 141 would contains a first capacitor $C_{C1}$ through which a first compensation current $IC_{C1}$ feeds back from the output voltage Vout to the output 301 (i.e. first node) of the input differential transistor pair (N1U N1D). The second compensation element 142 would contain a second capacitor $C_{C2}$ through which a second compensation current $IC_{C2}$ feeds back from the output voltage Vout to the input 302 (i.e. second node) of the first differential transistor pair (N4 N6).

As the output voltage experiences a voltage drop due to an external load to be attached to the LDO voltage regulator 100, the first compensation current $IC_{C1}$ and the second compensation current $IC_{C2}$ would turn on the power transistor of the pass element 130 faster. The first compensation current $IC_{C1}$ and the second compensation current $IC_{C2}$ would be fed back indirectly to the amplified error voltage.

In further detail, the aforementioned input differential transistor pair (N1U N1D) would have a first NMOS transistor N1U and a second NMOS transistor N1D, the reference voltage Vref would be received by the gates of the first NMOS transistor N1U and the second NMOS transistor N1D, and the first terminal of the first capacitor $C_{C1}$ would be connected to a first node 301 between a resource of the first NMOS transistor N1U and a drain of the second NMOS transistor N1D. In response to a step up of a load current, the output voltage Vout and a voltage of the first node 301 would experience a first voltage drop which is transferred through the first capacitor $C_{C1}$.

Also in further detail, the aforementioned the input transistor pair of the localized common-mode feedback circuit (N4 N6) would include a third NMOS transistor N4 and a fourth NMOS transistor N6, and the second terminal of the second capacitor $C_{C2}$ is connected to a second node 302 between a resource of the third NMOS transistor N4 and a drain of the fourth NMOS transistor N6. In response to a step up of a load current, the output voltage Vout and a voltage of the second node 302 would experience a second voltage drop which is transferred through the second capacitor $C_{c2}$ while the gates of the third NMOS transistor N4 and the fourth NMOS transistor N6 may experience a voltage increase.

In the LDO voltage regulator 100, various parameter values including the capacitance value of the first capacitor $C_{C1}$, the capacitor value of the second capacitor $C_{C2}$, an effective gain value (gm1) of the input differential transistor pair, and an effective gain value (gm2) of the first transistor pair of the localized common-mode feedback circuit, together, would be optimized so that non-dominant pole-zero doublets are very close together in a frequency domain.

Figure 4:
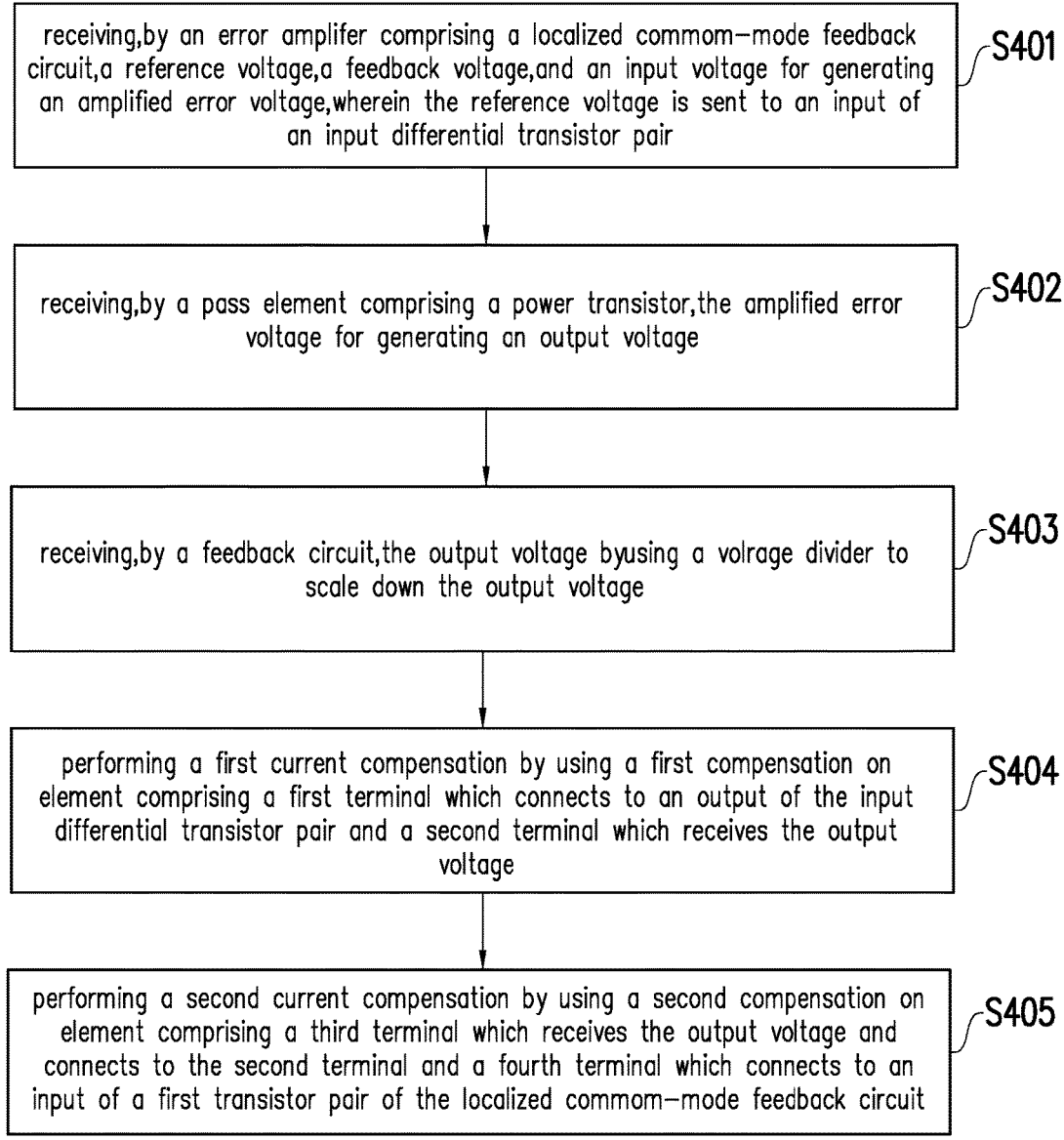
FIG. 4 illustrates steps of a method of regulating a voltage by using a LDO voltage regulator circuit with a local common-mode feedback in accordance with one of the exemplary embodiments of the disclosure.

FIG. 4 illustrates steps of a method of regulating a voltage by using a LDO voltage regulator circuit with a local common-mode feedback in accordance with one of the exemplary embodiments of the disclosure. In step S401, the LDO voltage regulator would receive, by an error amplifier having a localized common-mode feedback circuit, a reference voltage, a feedback voltage, and an input voltage for generating an amplified error voltage. The reference voltage would be sent to an input of an input differential transistor pair. In step S402, the LDO voltage regulator would receive, by a pass element comprising a power transistor, the amplified error voltage for generating an output voltage. In step S403, the LDO voltage regulator would receive, by a feedback circuit, the output voltage by using a voltage divider to scale down the output voltage. In step S404, the LDO voltage regulator would perform a first current compensation by using a first compensation element comprising a first terminal which connects to an output of the input differential transistor pair and a second terminal which receives the output voltage. In step S405, the LDO voltage regulator would perform a second current compensation by using a second compensation element that includes a third terminal which receives the output voltage and connects to the second terminal and a fourth terminal which connects to an input of a first transistor pair of the localized common-mode feedback circuit.

In one of the exemplary embodiments, the step of performing the first current compensation would include using a first capacitor through which a first compensation current feeds back from the output voltage to the output of the input transistor pair. Also the step of performing the second current compensation would include using a second capacitor through which a second compensation current feeds back from the output voltage to the input of the first differential transistor pair. As the output voltage experiences a voltage drop due to an external load, the first compensation current and the second compensation current would turn on the power transistor of the pass element faster. The first compensation current and the second compensation current would be fed back indirectly to the amplified error voltage.

In one of the exemplary embodiments, the step of performing the first current compensation would further include feeding back the first compensation current from the first terminal of the first capacitor to a first node between the input differential transistor pair, wherein the input differential transistor pair having a first NMOS transistor and a second NMOS transistor, and the first node is formed between a resource of the first NMOS transistor and a drain of the second NMOS transistor. In response to a step up of a load current, the output voltage and a voltage of the first node would experience a first voltage drop which is transferred through the first capacitor.

Similarly, the step of performing the second current compensation would further include feeding back the second compensation current from the second terminal of the second capacitor to a second node between the input transistor pair of the localized common-mode feedback circuit. The input transistor pair of the localized common-mode feedback circuit may include a third NMOS transistor and a fourth NMOS transistor, and the second node is formed between a resource of the third NMOS transistor and a drain of the fourth NMOS transistor. In response to a step up of a load current, the output voltage and a voltage of the second node would experience a second voltage drop which is transferred through the second capacitor while the gates of the third NMOS transistor and the fourth NMOS transistor experience a voltage increase.

In one of the exemplary embodiments, the method of FIG. 4 may further include optimizing each of a capacitor value of the first capacitor, a capacitor value of the second capacitor, an effective gain value of the input differential transistor pair, and an effective gain value of the first transistor pair of the localized common-mode feedback circuit so that non-dominant pole-zero doublets are very close together in a frequency domain.

Figure 5:
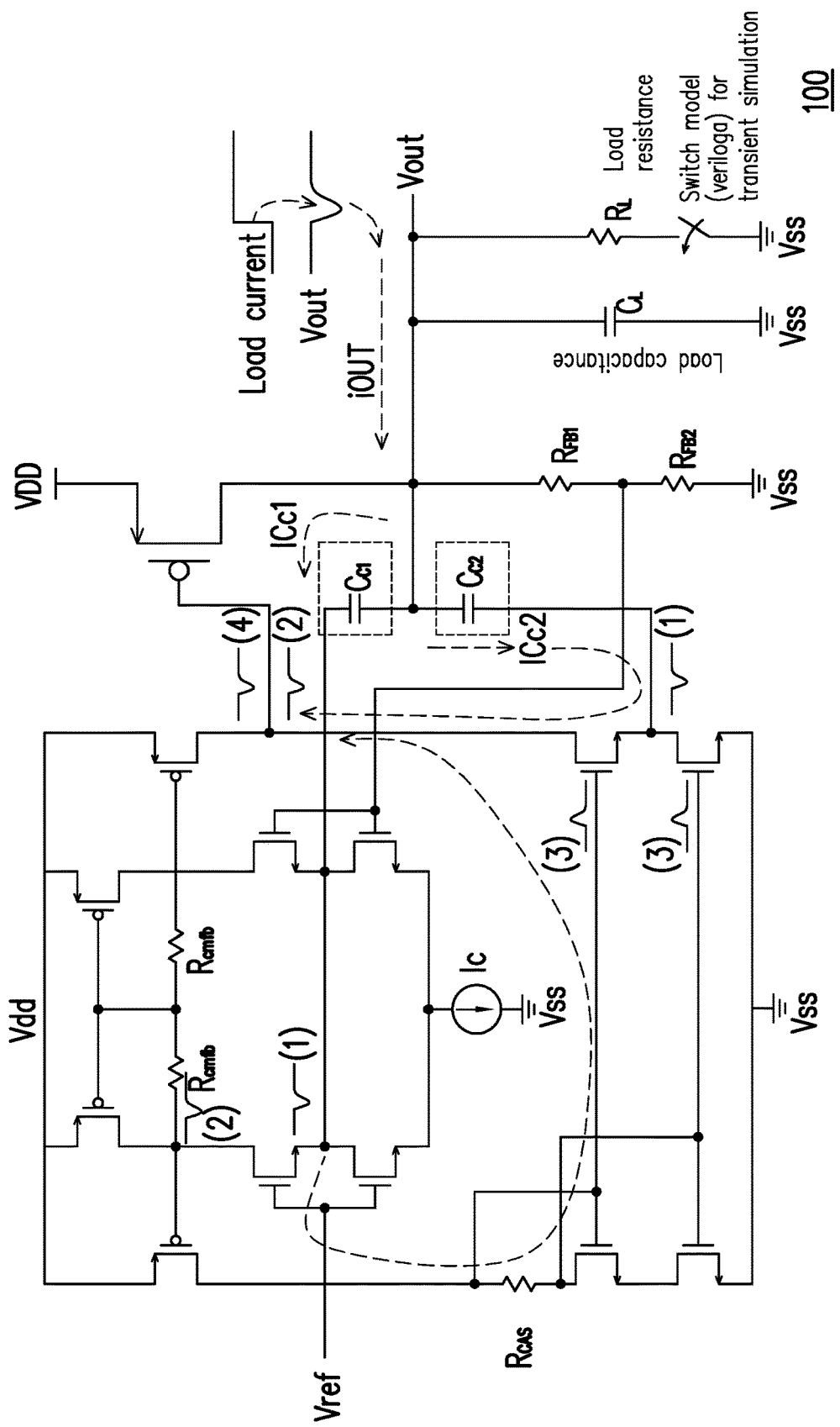
FIG. 5 illustrates an operating principle of the LDO voltage regulator circuit of FIG. 2 in accordance with one of the exemplary embodiments of the disclosure.

FIG. 5 illustrates an operating principle of the LDO voltage regulator circuit of FIG. 2 in accordance with one of the exemplary embodiments of the disclosure. As shown in FIG. 5, in response to a step up of a load current, the output voltage Vout would likely experience a sudden drop. As such, referring to FIG. 5, the voltage (1) in the $R_{cmfb}$ and the output voltage (2) of the input differential transistor pair may experience a sudden drop while the voltages (3) at the gates of the input transistor pair and the amplified error voltage (4) may experience a sudden increase. The compensation currents $IC_{C1}$ and $IC_{C2}$ would then be fed back from Vout and the phase of the compensation currents $IC_{C1}$ and $IC_{C2}$ would be the same or very similar to the phase of Vout.

For example, if the load current steps up at the output Vout of the LDO regulator 100, then the output voltage Vout may drop while the load capacitor (decoupling capacitor) supplies current to the load. This voltage drop at Vout is transferred through the compensation capacitors ($C_{C1}$ and $C_{C2}$) in the negative feedback loops. The compensation currents $IC_{C1}$ and $IC_{C2}$ would help PMOS pass transistor of the pass element 130 turned on faster. Because both of the compensation capacitors ($C_{C1}$ $C_{C2}$) are formed to indirectly fed back from the output voltage Vout of the LDO regulator to the output voltage (4) of the error amplifier 110, the transient response would be faster than a single compensation scheme.

Figure 6:
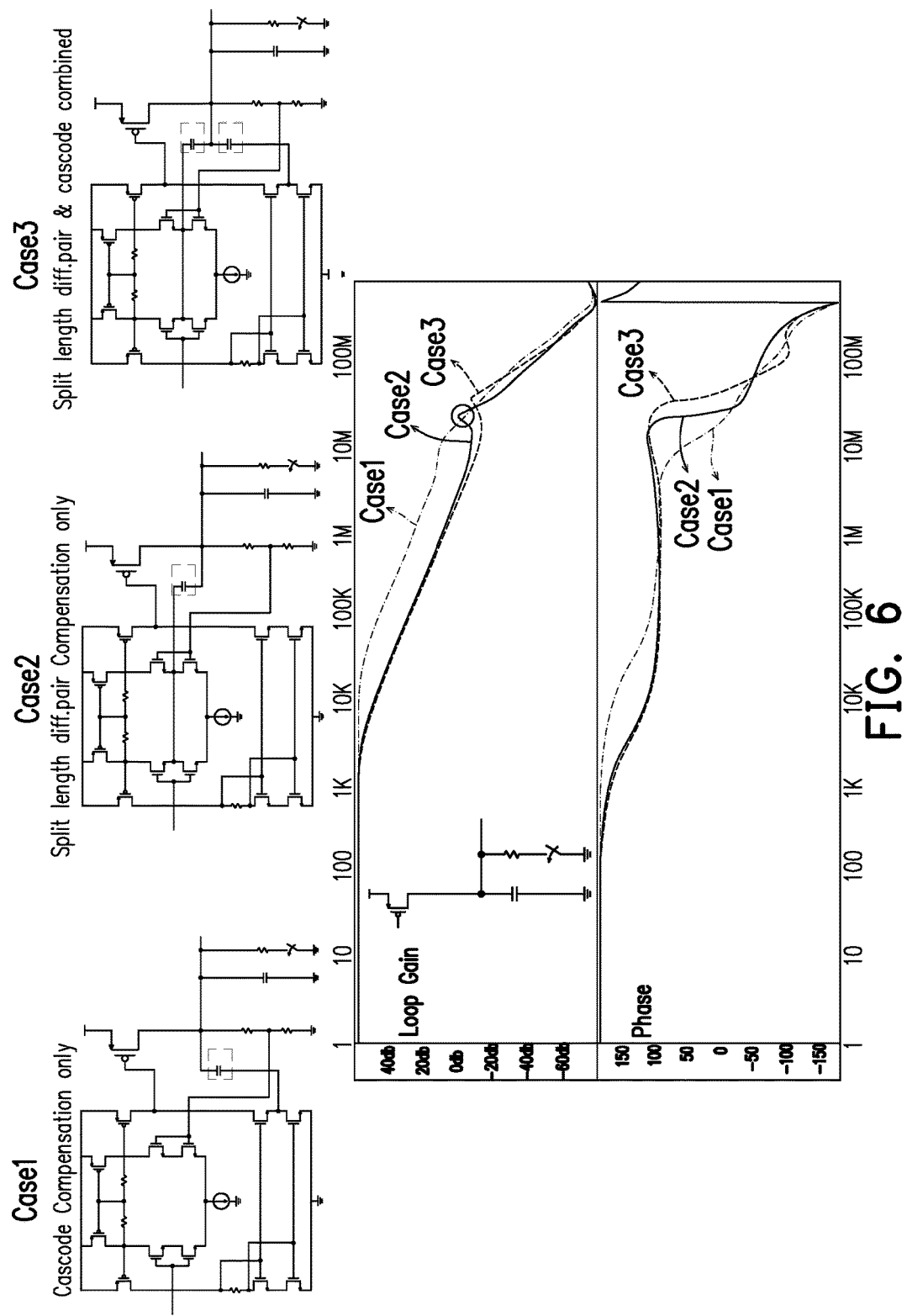
FIG. 6 is a plot which shows the LDO voltage regulator circuit of FIG. 2 and FIG. 3 having better phase margin and frequency stability.
Figure 7:
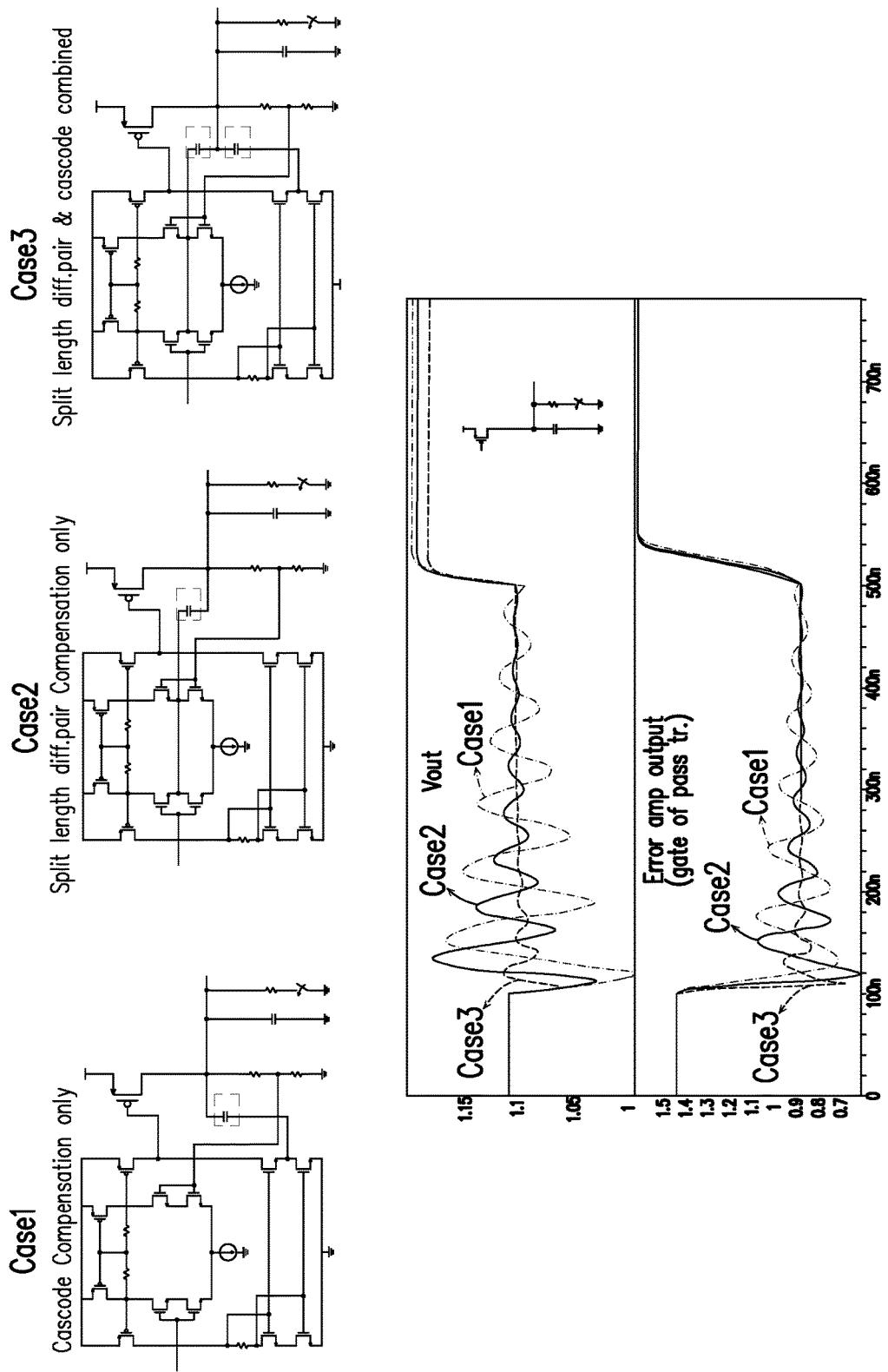
FIG. 7 is a plot which shows the LDO voltage regulator circuit of FIG. 2 and FIG. 3 having better transient response to load current step.

Experimental data of the LDO voltage regulator 100 are shown in FIG. 6 and FIG. 7. By using the test parameters of Vdd=1.6V, $R_L$=27.5 ohm with 40 mA load current, $C_L$=5 nF, $C_{C1}$=$C_{C2}$=9 pF, the loop gain and phase of case 1, case 2, and case 3 are shown in FIG. 6. Case 1 adopts the cascode compensation scheme only, Case 2 adopts the split length differential pair compensation scheme only, and Case 3 adopts a combination of the cascode compensation scheme and the split length differential pair compensation scheme. It can be seen from the plot that Case 3 performs better as it exhibits a better phase margin and a more stable frequency response.

FIG. 7 shows a comparison with the same three cases for the voltages at the output voltage Vout and at the output of the error amplifier 110 (or the input of the pass element 130). As seen in FIG. 7, under the same test parameter as FIG. 6, Case 3 performs better as it exhibits a better transient response to the step up of load current.

In view of the aforementioned descriptions, the present disclosure is suitable for being used in a mobile electronic device which rely upon an internal battery and is able to provide regulated voltage which is lower power and exhibits a fast and stable transient response.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of" multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A low drop-out (LDO) voltage regulator circuit comprising:
    an error amplifier comprising a localized common-mode feedback circuit, receiving a reference voltage, a feedback voltage, and an input voltage, and generating an amplified error voltage, wherein the reference voltage is sent to an input of an input differential transistor pair;
    a pass element comprising a power transistor, receiving the amplified error voltage, and generating an output voltage;
    a feedback circuit receiving the output voltage and comprising a voltage divider which scales down the output voltage;
    a first compensation element comprising a first terminal which connects to an output of the input differential transistor pair and a second terminal which receives the output voltage,
    wherein the first compensation element comprising a first capacitor through which a first compensation current feeds back from the output voltage to the output of the input transistor pair; and
    a second compensation element comprising a third terminal which receives the output voltage and connects to the second terminal and a fourth terminal which connects to an input of a first transistor pair of the localized common-mode feedback circuit;
    wherein the second compensation element comprising a second capacitor through which a second compensation current feeds back from the output voltage to the input of the first differential transistor pair,
    wherein the input transistor pair of the localized common-mode feedback circuit comprising a third NMOS transistor and a fourth NMOS transistor, and the second terminal of the second capacitor is connected to a second node between a source of the third NMOS transistor and a drain of the fourth NMOS transistor.

2. The LDO voltage regulator of claim 1, wherein as the output voltage experiences a voltage drop due to an external load, the first compensation current and the second compensation current turning on the power transistor of the pass element.

3. The LDO voltage regulator of claim 1, wherein the first compensation current and the second compensation current are fed back indirectly to the amplified error voltage.

4. The LDO voltage regulator of claim 1, wherein the input differential transistor pair comprising a first NMOS transistor and a second NMOS transistor, the reference voltage is received by gates of the first NMOS transistor and the second NMOS transistor, and the first terminal of the first capacitor is connected to a first node between a source of the first NMOS transistor and a drain of the second NMOS transistor.

5. The LDO voltage regulator of claim 4, wherein in response to a step up of a load current, the output voltage and a voltage of the first node experience a first voltage drop which is transferred through the first capacitor.

6. The LDO voltage regulator of claim 1, wherein in response to a step up of a load current, the output voltage and a voltage of the second node experience a second voltage drop which is transferred through the second capacitor while gates of the third NMOS transistor and the fourth NMOS transistor experience a voltage increase.

7. A method of regulating a voltage by using a low drop-out (LDO) voltage regulator circuit with a local common-mode feedback, the method comprising:
    receiving, by an error amplifier comprising a localized common-mode feedback circuit, a reference voltage, a feedback voltage, and an input voltage for generating an amplified error voltage, wherein the reference voltage is sent to an input of an input differential transistor pair;
    receiving, by a pass element comprising a power transistor, the amplified error voltage for generating an output voltage;

receiving, by a feedback circuit, the output voltage by using a voltage divider to scale down the output voltage;

performing a first current compensation by using a first compensation element comprising a first terminal which connects to an output of the input differential transistor pair and a second terminal which receives the output voltage, wherein performing the first current compensation using a first capacitor through which a first compensation current feeds back from the output voltage to the output of the input transistor pair; and performing a second current compensation by using a second compensation element comprising a third terminal which receives the output voltage and connects to the second terminal and a fourth terminal which connects to an input of a first transistor pair of the localized common-mode feedback circuit, wherein performing the second current compensation using a second capacitor through which a second compensation current feeds back from the output voltage to the input of the first differential transistor pair, wherein performing the second current compensation feeding back the second compensation current from the second terminal of the second capacitor to a second node between the input transistor pair of the localized common-mode feedback circuit, wherein the input transistor pair of the localized common-mode feedback circuit comprising a third NMOS transistor and a fourth NMOS transistor, and the second node is formed between a source of the third NMOS transistor and a drain of the fourth NMOS transistor.

8. The method of claim 7, wherein as the output voltage experiences a voltage drop due to an external load, the first compensation current and the second compensation current turning on the power transistor of the pass element faster.

9. The method of claim 7, wherein the first compensation current and the second compensation current are fed back indirectly to the amplified error voltage.

10. The method of claim 7, wherein performing the first current compensation further comprising:
  feeding back the first compensation current from the first terminal of the first capacitor to a first node between the input differential transistor pair, wherein the input differential transistor pair comprising a first NMOS transistor and a second NMOS transistor, and the first node is formed between a source of the first NMOS transistor and a drain of the second NMOS transistor.

11. The method of claim 10, wherein in response to a step up of a load current, the output voltage and a voltage of the first node experience a first voltage drop which is transferred through the first capacitor.

12. The method of claim 7, wherein in response to a step up of a load current, the output voltage and a voltage of the second node experience a second voltage drop which is transferred through the second capacitor while gates of the third NMOS transistor and the fourth NMOS transistor experience a voltage increase.

* * * * *